(12) United States Patent
Trinkle

(10) Patent No.: US 7,642,942 B2
(45) Date of Patent: Jan. 5, 2010

(54) SYSTEMS AND METHODS FOR SYNTHESIS OF A SIGNAL

(75) Inventor: William Joseph Trinkle, Tampa, FL (US)

(73) Assignee: Honeywell International Inc., Morristown, NJ (US)

( * ) Notice: Subject to any disclaimer, the term of this patent is extended or adjusted under 35 U.S.C. 154(b) by 0 days.

(21) Appl. No.: 12/124,913

(22) Filed: May 21, 2008

(65) Prior Publication Data

US 2009/0289825 A1    Nov. 26, 2009

(51) Int. Cl.
*H03M 1/66* (2006.01)
(52) U.S. Cl. .................. 341/147; 341/144; 375/376
(58) Field of Classification Search ............. 341/144, 341/147; 327/105; 375/376
See application file for complete search history.

(56) References Cited

U.S. PATENT DOCUMENTS

| 4,590,513 | A | 5/1986 | Craft |
| 5,151,661 | A | 9/1992 | Caldwell et al. |
| 5,931,891 | A | 8/1999 | Landry |
| 7,333,209 | B2 | 2/2008 | Greening et al. |
| 2003/0185331 | A1* | 10/2003 | Agizim et al. .............. 375/376 |
| 2007/0103691 | A1 | 5/2007 | Greening et al. |
| 2007/0164793 | A1* | 7/2007 | Kim .......................... 327/105 |

* cited by examiner

*Primary Examiner*—Jean B Jeanglaude
(74) *Attorney, Agent, or Firm*—Fogg & Powers LLC

(57) ABSTRACT

Systems and methods synthesize a signal from the odd harmonic frequency components of an input signal. An exemplary embodiment synthesizes a first signal with a digital to analog converter (DAC), generates a second signal from the first signal, and filters a selected one of the odd harmonic frequency components through a band pass filter to produce an output signal. The first signal is defined by a first frequency. The second signal is defined by the first frequency and includes a fundamental frequency component and plurality of odd harmonic frequency components. The output signal has a frequency substantially equal to the frequency of the selected odd harmonic frequency component.

17 Claims, 1 Drawing Sheet

SYSTEMS AND METHODS FOR SYNTHESIS OF A SIGNAL

BACKGROUND OF THE INVENTION

Direct Digital Synthesis (DDS) devices create waveform outputs with an accurate and tunable frequency. In some applications, the DDS output waveform frequency cannot be tuned high enough for the application. For example, radiation hardened systems and/or devices may use a DDS device. However, due to input clock rate limitations, the frequency of an output signal generated by the radiation hardened DDS device may not be sufficiently high for some applications, such as when the output waveform is used as a clock signal source for a system that requires a relatively high clock rate. Accordingly, it is desirable to increase the frequency of the output waveform.

SUMMARY OF THE INVENTION

Systems and methods of synthesizing a signal from the odd harmonic frequency components of an input signal are disclosed. An exemplary embodiment has a digital to analog converter (DAC), a comparator, and a band pass filter. The DAC is operable to generate a first signal defined by a first frequency. The comparator is communicatively coupled to the DAC, is operable to receive the first signal from the DAC, and is operable to generate a substantially square-shaped waveform signal in response to receiving the first signal, wherein the substantially square-shaped waveform signal comprises a fundamental frequency component and plurality of odd harmonic frequency components. The band pass filter is communicatively coupled to the comparator, is operable to receive the substantially square-shaped waveform signal from the comparator, and is operable to filter the substantially square-shaped waveform signal to produce an output signal corresponding to a selected one of the odd harmonic frequency components of the substantially square-shaped waveform signal received from the comparator, wherein the band pass filter output signal has a frequency substantially equal to the frequency of the selected odd harmonic frequency component.

In accordance with further aspects, an exemplary embodiment synthesizes a first signal with a digital to analog converter (DAC), generates a second signal from the first signal, and filters a selected one of the odd harmonic frequency components through a band pass filter to produce an output signal. The first signal is defined by a first frequency. The second signal is defined by the first frequency and comprises a fundamental frequency component and plurality of odd harmonic frequency components. The output signal has a frequency substantially equal to the frequency of the selected odd harmonic frequency component.

BRIEF DESCRIPTION OF THE DRAWINGS

Preferred and alternative embodiments are described in detail below with reference to the following drawings.

DETAILED DESCRIPTION OF THE PREFERRED EMBODIMENT

Figure 1:
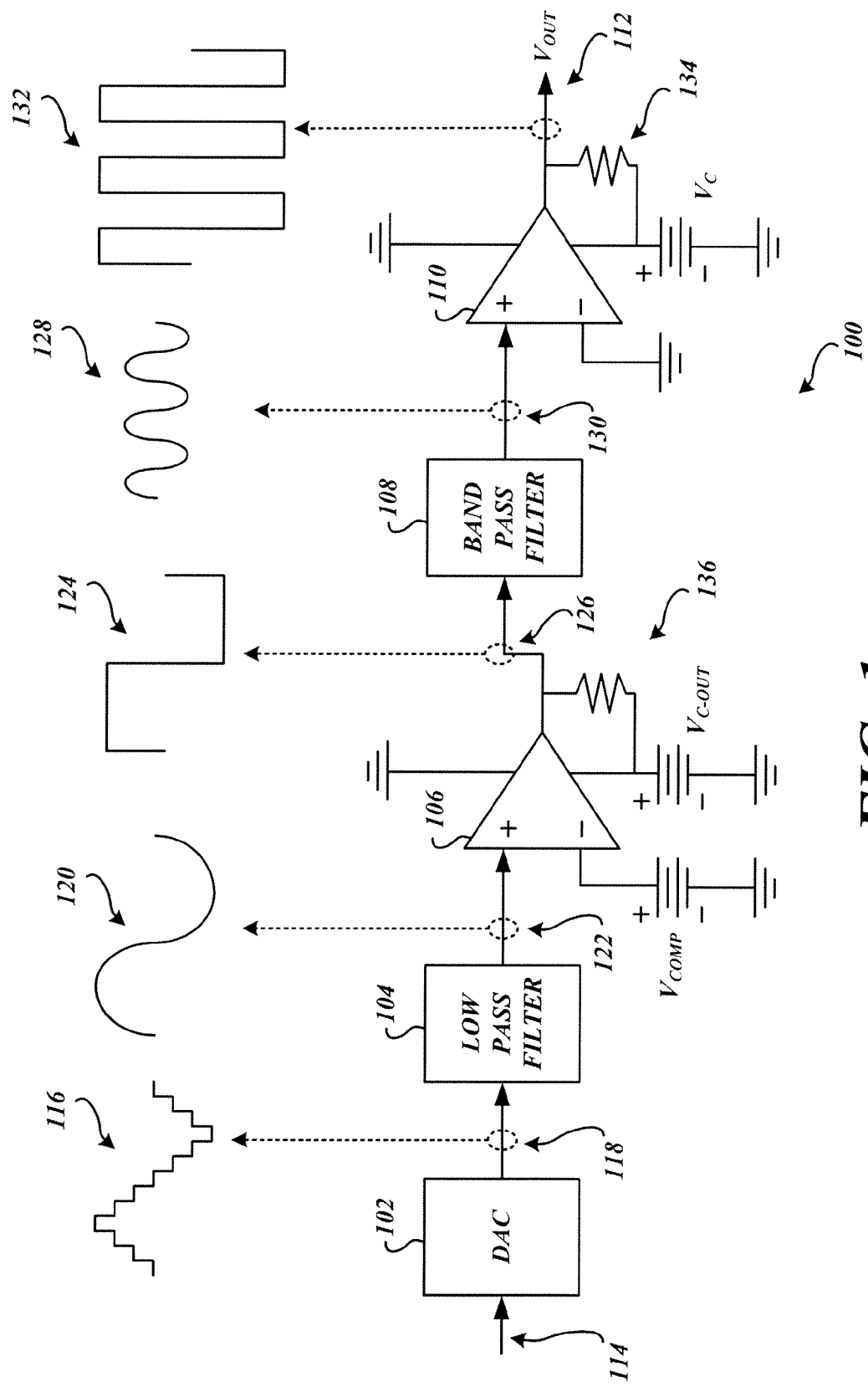
FIG. 1 is a block diagram of an embodiment of the direct digital simulation (DDS) harmonic waveform generation system.

FIG. 1 is a block diagram of an embodiment of a direct digital simulation (DDS) harmonic waveform synthesizing system 100. Embodiments of the DDS harmonic waveform synthesizing system 100 generate a waveform, such as, but not limited to, a clock signal, that may be used as an input to other devices. The output waveform corresponds to an odd harmonic of the output waveform of a digital to analog (DAC) converter 102. The DDS harmonic waveform synthesizing system 100 comprises the DAC converter 102, an optional low pass filter 104, a first comparator 106, a band pass filter 108, and an optional second comparator 110. The output signal $V_{OUT}$ 112 from the DDS harmonic waveform synthesizing system 100 may be used as an input signal to another system and/or device (not shown).

A digital input 114 provided to the DAC converter 102 results in generation of, or synthesis of, an analog signal 116 at the output 118 of the DAC converter 102. In one embodiment, the DAC converter 102 is a radiation hardened converter. Due to the radiation hardening, the frequency of the output analog signal 116 is limited to a relatively low value (in comparison to non-radiation hardened DACs). In alternative embodiments, any suitable DAC converter may be used, such as, but not limited to, a DAC converter 102 that is not radiation hardened.

In some applications, the analog signal 116 generated by, or synthesized by, the DAC converter 102 may require smoothing or the like. Accordingly, the output analog signal 116 is input to the optional low pass filter 104. The low pass filter 104 outputs a signal 120 at its output 122. In this exemplary embodiment, the output signal 120 may be generally described as a sine wave.

The signal 120 from the low pass filter 104 is input to the first comparator 106. The first comparator 106 compares the voltage of the signal 120 to a comparison voltage, $V_{COMP}$. When the voltage of the signal 120 is greater than the voltage of $V_{COMP}$, a comparator output signal 124 at the output 126 is a logical high. When the voltage of the signal 120 is less than the voltage of $V_{COMP}$, the comparator output signal 124 at the output 126 is a logical low. Accordingly, the comparator output signal 124 has a square-shaped waveform in this exemplary embodiment. The comparator output signal 124, due to its substantially square-shaped waveform, comprises a fundamental frequency and plurality of odd harmonic frequency components.

The square-shaped waveform of the comparator output signal 124 may be suitable as a clocking signal for some devices (not shown). For example, the comparator output signal 124 may have a frequency that is suitable for another device. However, in some situations, the frequency of the comparator output signal 124 may not be sufficiently high enough for other applications. For example, but not limited to, a relatively high frequency clocking signal may be required in the other application. Accordingly, synthesis of a higher frequency signal is generated by embodiments of the DDS harmonic waveform synthesizing system 100.

As noted above, the square-shaped waveform of signal 124 is known to contain odd harmonic frequency components. The largest magnitude odd harmonic is the third harmonic. To generate a higher frequency signal, the odd harmonic frequency component of the square-shaped waveform of signal 124 is selectively passed through the band pass filter 108. Accordingly, the comparator output signal 124 is input to the band pass filter 108. The frequency range of the band pass filter 108 is set to correspond to the desired odd harmonic frequency of the square-shaped waveform of signal 124. Thus, the fundamental frequency component and the non-selected odd harmonic frequency components are attenuated or blocked, while the selected odd harmonic frequency component passes through the band pass filter 108.

In this exemplary embodiment, the band pass filter 108 frequency range corresponds to the third harmonic frequency of the square-shaped waveform of signal 124. Accordingly, the third harmonic frequency component of the square-shaped waveform of signal 124 passes through the band pass filter 108, while the fundamental frequency of the square-shaped waveform of signal 124 and its other harmonic frequency components are attenuated (blocked).

The output signal 128 provided at the output 130 of the band pass filter 108 is a signal corresponding to the selected third harmonic frequency of the square-shaped waveform of the comparator output signal 124. The waveform of the output signal 128 is conceptually illustrated as a sine-shaped waveform with an amplitude less than the square-shaped waveform of the comparator output signal 124. Further, the frequency of the output signal 128 is substantially equal to three times the frequency of the square-shaped waveform of the comparator output signal 124 since the output signal 128 corresponds to the third harmonic frequency component of the comparator output signal 124.

In some embodiments, the higher frequency output signal 128 from the band pass filter 108 may be directly used by some systems and/or devices (not shown). However, in other situations, the output signal 128 may not have a sufficient amplitude or edge rate to perform an intended task. For example, a clocking signal with a frequency corresponding to the frequency of the output signal 128, but with a greater amplitude and sharper edges, may be needed for a specific application.

Accordingly, the output signal 128 from the band pass filter 108 is input to an optional second comparator 110. In this exemplary embodiment, when the output signal at output 130 is greater than ground, the output signal 132, corresponding to $V_{OUT}$ 112, is a logical high. When the output signal 128 is less than ground, the output signal 132, corresponding to $V_{OUT}$ 112, is a logical low.

In this exemplary embodiment, a pull-up resistor 134 is used to pull the voltage of the output signal $V_{OUT}$ 112 to a value corresponding to $V_c$ when the output of the second comparator 110 is at a logical high. Thus, the amplitude of the output signal $V_{OUT}$ 112 may be controllable to a desired value based upon selection of $V_c$. Accordingly, an amplified output signal $V_{OUT}$ 112 is generated from the output signal 128. Further, other circuitry (not shown) may be employed to provide one or more other controllable voltages from the output signal $V_{OUT}$ 112.

The above-described embodiments were described as using the third harmonic frequency component of a generated signal to generate the output signal $V_{OUT}$ 112. In some situations, the frequency of the third harmonic frequency component of the square-shaped waveform of comparator output signal 124 may not be high enough for a particular application. Accordingly, the band pass filter 108 may have its band pass frequency set to correspond to another one of the odd harmonic frequencies (fifth harmonic, seventh harmonic, ninth harmonic, etc.) of the comparator output signal 124. The frequency of the output signal 128 would then correspond to the frequency of the selected odd harmonic. Thus, the fundamental frequency component, the third harmonic frequency component, and the non-selected odd harmonic frequency components, are blocked by the band pass filter 108.

For example, the band pass filter 108 may be tuned to the fifth harmonic frequency component, thus blocking the fundamental frequency component, the third harmonic frequency component, and the other odd harmonic frequency components of the comparator output signal 124. Accordingly, an output signal 128 is generated having a frequency corresponding to the fifth harmonic frequency component of the square wave, which is substantially five times the frequency of the square-shaped waveform of the comparator output signal 124. This output signal 128 may be amplified, if necessary, to a desired voltage using the second comparator 110.

In the exemplary embodiment of the DDS harmonic waveform synthesizing system 100, the first comparator 106 is an open collector or open drain type comparator. Accordingly, there is no active voltage pull-up for the output 126. Accordingly, an external pull-up circuit 136 is employed to pull the output of the first comparator 106 to the voltage $V_{C\text{-}OUT}$.

Since the output signal $V_{OUT}$ 112 of the exemplary embodiment of the DDS harmonic waveform synthesizing system 100 is itself a square wave form, the output signal $V_{OUT}$ 112 has its own set of odd harmonic frequency components. Accordingly, if even higher frequency signals are required, the output signal $V_{OUT}$ 112 may be input to another band pass filter (not shown) and its odd harmonic frequency components may be processed as described above to generate a higher frequency output signal.

Alternative embodiments may use any suitable type of device or circuit, such as, but not limited to, integrated circuit transistors, for the first comparator 106 and/or the second comparator 110. For example, two transistors may be operated cooperatively in a push-pull configuration so that the above-described output signals 124 and/or 132 are generated. Any suitable configuration of transistors or other components may be used to generate the above-described output signals 124 and/or 132.

The second comparator 110 of the above-described embodiment of the DDS harmonic waveform synthesizing system 100 had its comparison voltage set to ground. In an alternative embodiment, another comparator voltage may be used, similar to $V_{COMP}$ used by the first comparator 106.

Further, the above-described output signals 124 and/or 132 were described as having a square wave form. Other wave forms that have discernable odd harmonic frequency components may be used by alternative embodiments.

While the preferred embodiment of the invention has been illustrated and described, as noted above, many changes can be made without departing from the spirit and scope of the invention. Accordingly, the scope of the invention is not limited by the disclosure of the preferred embodiment. Instead, the invention should be determined entirely by reference to the claims that follow.

The invention claimed is:

1. A method for synthesizing a signal, comprising:
   synthesizing a first signal with a digital to analog converter (DAC), the first signal defined by a first frequency;
   generating a second signal from the first signal, the second signal defined by the first frequency and comprising a fundamental frequency component and plurality of odd harmonic frequency components; and
   filtering a selected one of the odd harmonic frequency components through a band pass filter to produce an output signal, wherein the output signal has a frequency substantially equal to the frequency of the selected odd harmonic frequency component.

2. The method of claim 1, wherein generating the second signal further comprises:
   generating a substantially square-shaped waveform signal.

3. The method of claim 1, wherein passing the selected one of the odd harmonic frequency components further comprises:

passing a third harmonic frequency component through the band pass filter; and generating an output signal from the passed third harmonic frequency component, wherein the output signal has a frequency substantially equal to the frequency of the third harmonic frequency component.

4. The method of claim 1, further comprising:

outputting the passed selected one of the odd harmonic frequency components to at least one of a system or a device.

5. The method of claim 1, further comprising:

generating an amplified output signal from the passed selected one of the odd harmonic frequency components.

6. The method of claim 5, further comprising:

providing the amplified output signal to at least one of a system or a device.

7. A signal synthesizing system, comprising:

a digital to analog converter (DAC) operable to generate a first signal, the first signal defined by a first frequency;

a comparator communicatively coupled to the DAC, operable to receive the first signal from the DAC, and operable to generate a substantially square-shaped waveform signal in response to receiving the first signal, wherein the substantially square-shaped waveform signal comprises a fundamental frequency component and plurality of odd harmonic frequency components; and a band pass filter communicatively coupled to the comparator, operable to receive the substantially square-shaped waveform signal from the comparator, and operable to filter the substantially square-shaped waveform signal to produce an output signal corresponding to a selected one of the odd harmonic frequency components of the substantially square-shaped waveform signal received from the comparator, wherein the band pass filter output signal has a frequency substantially equal to the frequency of the selected odd harmonic frequency component.

8. The signal synthesizing system of claim 7, wherein the band pass filter is operable to pass a third harmonic frequency component of the substantially square-shaped waveform signal received from the comparator, and operable to block the fundamental frequency component and the remaining ones of the plurality of odd harmonic frequency components of the substantially square-shaped waveform signal received from the comparator.

9. The signal synthesizing system of claim 7, wherein the comparator is a first comparator, and further comprising:

a second comparator communicatively coupled to band pass filter, operable to receive the band pass filter output signal, and further operable to generate an amplified output signal that corresponds to the frequency of the received selected one of the odd harmonic frequency components.

10. The signal synthesizing system of claim 9, wherein the amplified output signal of the second comparator has an amplitude greater than the received band pass filter output signal.

11. The signal synthesizing system of claim 9, wherein the second comparator comprises one of an open collector type comparator and an open drain type comparator.

12. The signal synthesizing system of claim 7, wherein the comparator comprises one of an open collector type comparator and an open drain type comparator.

13. A system for synthesizing a signal, comprising:

means for synthesizing a first signal defined by a first frequency;

means for generating a second signal from the synthesized first signal, the second signal defined by the first frequency, and comprising a fundamental frequency component and plurality of odd harmonic frequency components; and means for selecting one of the odd harmonic frequency components of the second signal, wherein the output signal has a frequency substantially equal to the frequency of the selected odd harmonic frequency component.

14. The system of claim 13, wherein the selected one of the odd harmonic frequency components of the second signal is a substantially square-shaped waveform signal.

15. The system of claim 13, wherein the means for selecting selects a third harmonic frequency component of the second signal.

16. The system of claim 13, further comprising:

means for outputting the selected one of the odd harmonic frequency components of the second signal to at least one of a system or a device.

17. The system of claim 13, further comprising:

means for generating an amplified output signal from the selected one of the odd harmonic frequency components of the second signal.

* * * * *